United States Patent
Chu et al.

(10) Patent No.: US 7,136,299 B2
(45) Date of Patent: Nov. 14, 2006

(54) HIGH-DENSITY PHASE CHANGE CELL ARRAY AND PHASE CHANGE MEMORY DEVICE HAVING THE SAME

(75) Inventors: Eu Gene Chu, Seongnam-si (KR); Ju Ho Mo, Seoul (KR); Seong Taek Park, Seoul (KR); Jung Ho Kim, Seoul (KR); Hyun Yong Lim, Seoul (KR); Pyeong Han Lee, Suwon-si (KR); Ja Choon Jeong, Seoul (KR)

(73) Assignee: BeyondMicro Inc, Seoul (KR)

( * ) Notice: Subject to any disclaimer, the term of this patent is extended or adjusted under 35 U.S.C. 154(b) by 239 days.

(21) Appl. No.: 10/929,243

(22) Filed: Aug. 30, 2004

(65) Prior Publication Data

US 2005/0270832 A1    Dec. 8, 2005

(30) Foreign Application Priority Data

Jun. 4, 2004    (KR)    .................. 10-2004-0040638

(51) Int. Cl.
*G11C 11/00*    (2006.01)

(52) U.S. Cl. .............. 365/163; 365/148; 365/158; 257/537; 257/538; 257/539; 257/540; 257/541; 257/542; 257/543

(58) Field of Classification Search ........... 365/163, 365/148, 158; 257/537–543
See application file for complete search history.

(56) References Cited

U.S. PATENT DOCUMENTS

2005/0185444 A1*    8/2005    Yang et al. ............... 365/148
2005/0247922 A1*    11/2005    Oh et al. ..................... 257/4

* cited by examiner

*Primary Examiner*—Richard Elms
*Assistant Examiner*—Pho M. Luu
(74) *Attorney, Agent, or Firm*—The Webb Law Firm

(57) ABSTRACT

A phase change memory device and, more particularly, to a phase change memory cell array suitable for the implementation of a high-density memory device. The phase change memory cell array includes a first access transistor pair and a second access transistor pair formed on a semiconductor substrate to be adjacent to each other while each of the first and second access transistor pairs having a common drain, phase change resistance elements formed on source regions of the access transistors, respectively, and a semiconductor region formed on the same plane as the common drains to electrically connect the common drains of the first and second transistor pairs. The phase change memory cell array and the memory device of are suitable for the implementation of a high-density semiconductor device, and capable of improving the reliability of a contact forming process by securing a sufficient space for the contact forming process.

9 Claims, 10 Drawing Sheets

HIGH-DENSITY PHASE CHANGE CELL ARRAY AND PHASE CHANGE MEMORY DEVICE HAVING THE SAME

BACKGROUND OF THE INVENTION

1. Field of the Invention

The present invention relates generally to a phase change memory device and, more particularly, to a phase change memory cell array suitable for the implementation of a high-density memory device.

2. Description of the Related Art

With the popularization of portable devices, demands for nonvolatile memory devices are increasing. As for the nonvolatile memory devices, ferroelectric memory, magnetic memory and phase change memory, except for flash memory that is widely used at present, have attracted attention. Especially, the phase change memory can overcome the disadvantages of the flash memory, such as a slow access speed and a limitation in the number of times of use, and solve the problem in which a high voltage is required at the time of operation. Therefore, research has focused on the development of the phase change memory to develop new promising memory devices.

The phase change memory is a memory device using Chalcogenide-based phase change materials mainly including Te or Se of Chalcogene elements belonging to group 16 (VIA) of the periodic table as the material of a resistance element. In particular, Ge—Sb—Te (mainly, $Ge_2Sb_2Te_5$)-based materials are mainly used as phase change materials. A phase change resistance element exhibits the phase change characteristics in which the phase of a material is changed from a crystalline phase to an amorphous phase and vice versa according to the application conditions of thermal energy depending on the initial state of the material. The two phases have considerable differences in physical characteristics, such as an optical constant and resistivity, and the characteristics can be used in a memory device for performing the recording, removal and reproduction of information.

FIG. 1a is a graph used to explain a digital data storage device that uses the electrical characteristics of the phase change resistance element used in the phase change memory device.

If the phase change resistance element is heated to a melting point and then rapidly cooled by applying a high-voltage amorphizing reset pulse for a short time, as shown in the drawing, a phase change material is amorphised. Additionally, if the phase change resistance element is heated to the temperature between a crystallization temperature Tc and a melting point Tm by applying a low-voltage crystallizing set pulse for a long time, the phase change material is crystallized. The resistivity of the phase change resistance element varies during a phase change, and the resistivity in the amorphous phase is higher than that in the crystalline phase. In the phase change memory device, the state where the phase change resistance element is in a low-resistance crystalline phase is defined as a 'set' or 'ON' state, and the state where the phase change resistance element is in a high-resistance amorphous phase is defined as a 'reset' or 'OFF' state. The two states correspond to the logic values '0' and '1' of each memory cell, respectively.

FIG. 1b is a graph showing the resistance variations of the phase change resistance element according to a current pulse normalized to a critical reset current pulse value. In the graph, it can be understood that, when an initial state is a set state, there is no change attributable to the increase of a pulse size and, thereafter, the initial state is transitions to a reset state at or above a critical reset current (which is indicated by '□'). In contrast, when an initial state is a reset state, the initial state is first transitions to the crystalline phase according to the increase of the pulse size and, thereafter, transitions to the reset state at or above the critical reset current (which is indicated by '■'). Furthermore, as understood from the graph, the resistivity in the reset state is different from that in the set state 100 or more times, which assures that a sufficient signaling ratio can be secured only by the phase change of the local region of the phase change resistance element.

FIG. 2 is a circuit diagram showing the equivalent circuit of a conventional memory unit cell using the phase change resistance element.

Referring to FIG. 2, a phase change memory cell includes a single access transistor $T_A$, such as a Field Effect Transistor (FET), and a phase change resistance element GST. The lower electrode of the phase change resistance element GST is connected to the source of the transistor $T_A$, and the upper electrode thereof is connected to a plate electrode PL. The drain of the access transistor $T_A$ is connected to a bit line BL and the gate thereof is connected to a word line. The construction of the conventional phase change memory unit cell is similar to that of a dynamic random access memory (DRAM) unit cell, except for the substitution of a capacitor with the phase change resistance element.

FIG. 3 is a cross section showing the sectional structure of a conventional phase change memory device formed on a semiconductor substrate using the phase change memory cell of FIG. 2 as the unit thereof.

Referring to FIG. 3, isolation layer 36 for defining the active region of a semiconductor device are formed in the predetermined regions of a semiconductor substrate 30. A pair of word lines 38 functioning as the gates of transistors, respectively, is arranged in parallel to intersect the active region. The word lines 38 define the source regions 42 and drain region 40 of the transistors. That is, the active region between the pair of word lines 38 corresponds to the common drain region 40 of the transistors, and the two regions outside the word lines 38 correspond to the source regions 42 of the transistors. As shown in the drawing, a first interlayer-dielectric 48 is placed on the semiconductor substrate 30 and the tops of the transistors, and the common drain region 40 of the transistors is electrically connected to the bit line 44 through a bit line contact that passes through the first interlayer-dielectric 48. A second interlayer-dielectric 50 is placed on the first interlayer insulation film 48 including the bit line 44, and phase change resistance elements 65 each including a lower electrode 52, a phase change resistance film 62a and an upper electrode 64a are formed on the second interlayer-dielectric 50. The phase change resistance elements 65 are electrically connected to the source regions 42 of the transistors through contacts 46, respectively, which pass through the first and second interlayer-dielectrics 48 and 50. Even though not shown in the drawing, a planar interlayer-dielectric is placed on the phase change resistance elements 65, and a plate electrode is placed on the planar interlayer insulation film.

As described above, in the conventional phase change memory device, the common drain region on the semiconductor substrate is electrically connected to the bit line through the bit line contact. In such a structure, a sufficient space for a contact forming process should be secured on the common drain, which unavoidably increases an area occupied by the unit cell. Accordingly, the conventional phase change memory device adopts a cell structure unsuitable for the implementation of a high-density phase change memory device.

SUMMARY OF THE INVENTION

Accordingly, the present invention has been made keeping in mind the above problems occurring in the prior art, and an object of the present invention is to provide a phase change cell array structure suitable for the implementation of a high-density memory device, and a phase change memory device having the same.

In order to accomplish the above object, the present invention provides a phase change memory cell array, including a first access transistor pair and a second access transistor pair formed on a semiconductor substrate to be adjacent to each other, each of the first and second access transistor pairs having a common drain, phase change resistance elements formed on source regions of the access transistors, respectively, and a semiconductor region formed on the same plane as the common drains to electrically connect the common drains of the first and second transistor pairs.

The semiconductor region may be electrically connected to a power voltage, and each of the phase change resistance elements may be electrically connected to a bit line. Preferably, the semiconductor region may have the same conductivity type as the common drains.

In order to accomplish the above object, the present invention provides a phase change memory device, including a plurality of first active regions arranged at regular intervals on a semiconductor substrate, a plurality of word lines intersecting the first active regions and defining source regions and common drain regions of the first active regions, a plurality of bit lines intersecting the plurality of word lines at right angles, a plurality of second active regions located on the same plane as the common drain regions so as to connect at least two common drain regions that are adjacent to each other in a direction parallel to the word lines, and phase change resistance elements formed on the source regions of the first active regions, respectively, and electrically connected to bit lines.

In accordance with a preferred embodiment of the present invention, the plurality of second active regions may be extended to outsides of the at least two adjacent common drain regions in a direction parallel to the word lines, and the phase change memory device further includes contacts formed on the second active regions outside the common drain regions to supply a power voltage to the common drain regions.

In accordance with a preferred embodiment of the present invention, the plurality of word lines may define parts of the first active regions as the source regions and the common drain region in such a way that a pair of the word lines intersects the first active region, and the gap between the pair of word lines formed on the second active regions outside the common drain regions is wider than that formed on the common drain regions.

The second active regions may be semiconductor regions having the same conductivity type as the common drain regions, and the bit lines may be aligned on same lines as the first active regions when viewed in the vertical direction of the substrate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
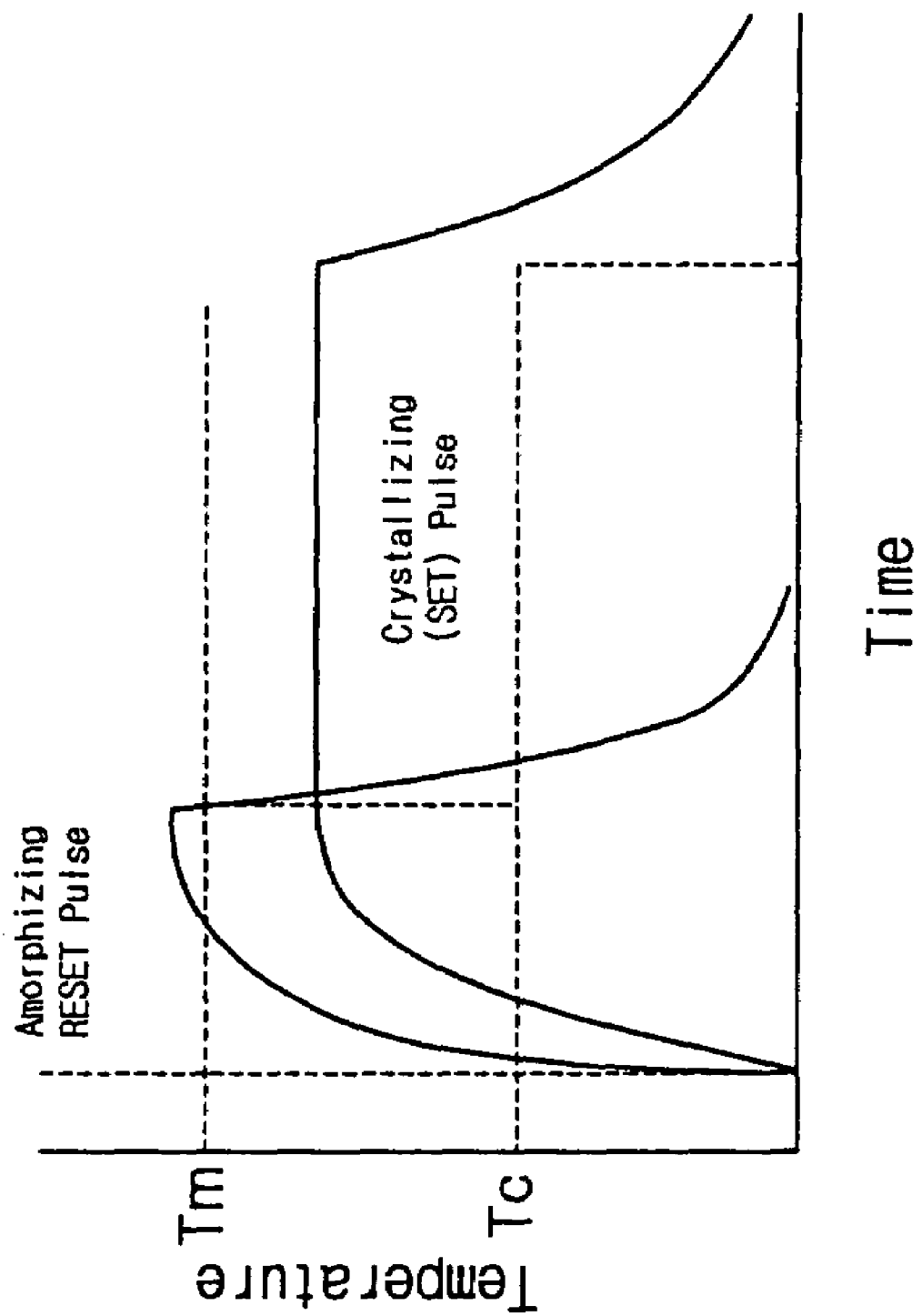
FIG. 1a is a graph used to explain a digital data storage device that uses the electrical characteristics of the phase change resistance element used in a conventional phase change memory device.
Figure 1B:
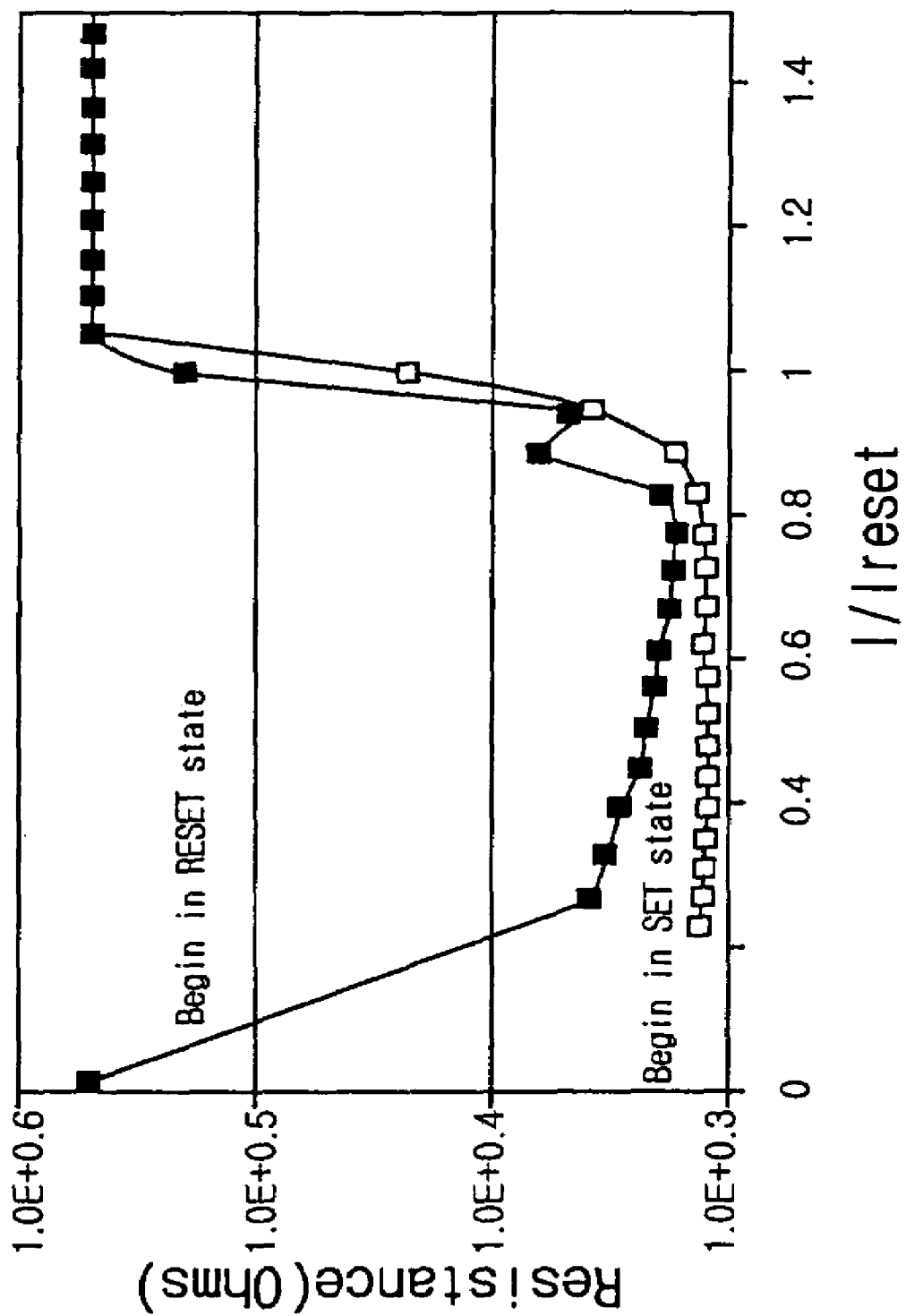
FIG. 1b is a graph showing the resistance variations of the phase change resistance element according to a current pulse normalized to a critical reset current pulse value.

Reference now should be made to the drawings, in which the same reference numerals are used throughout the different drawings to designate the same or similar components.

Figure 4:
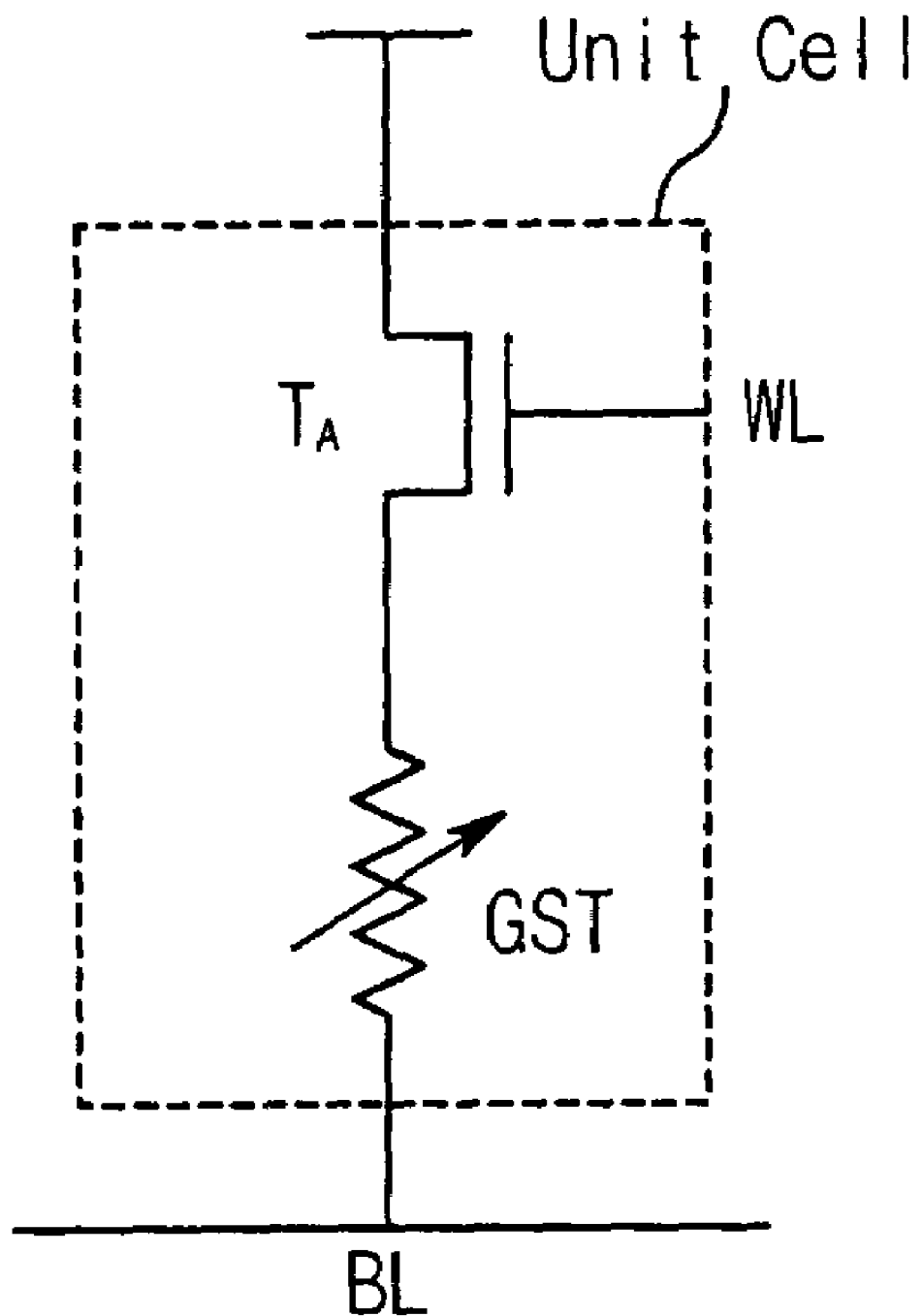
FIG. 4 is a circuit diagram showing the equivalent circuit of a unit cell that constitutes a phase change memory device according to an embodiment of the present invention.
Figure 5:
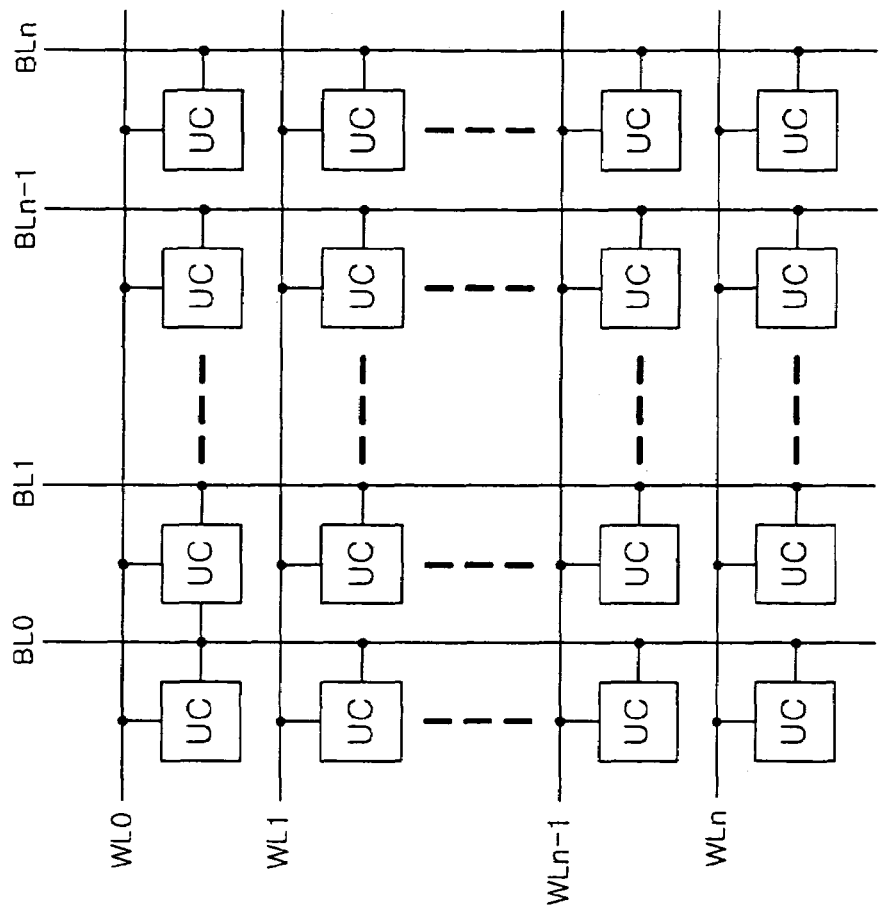
FIG. 5 is a block diagram showing a memory cell array according to the present invention.

FIG. 4 is a circuit diagram showing the equivalent circuit of a unit cell that constitutes a phase change memory device according to an embodiment of the present invention. FIG. 5 is a block diagram showing a memory cell array in which the unit cell of FIG. 4 is repeated according to the embodiment of the present invention.

Figure 2:
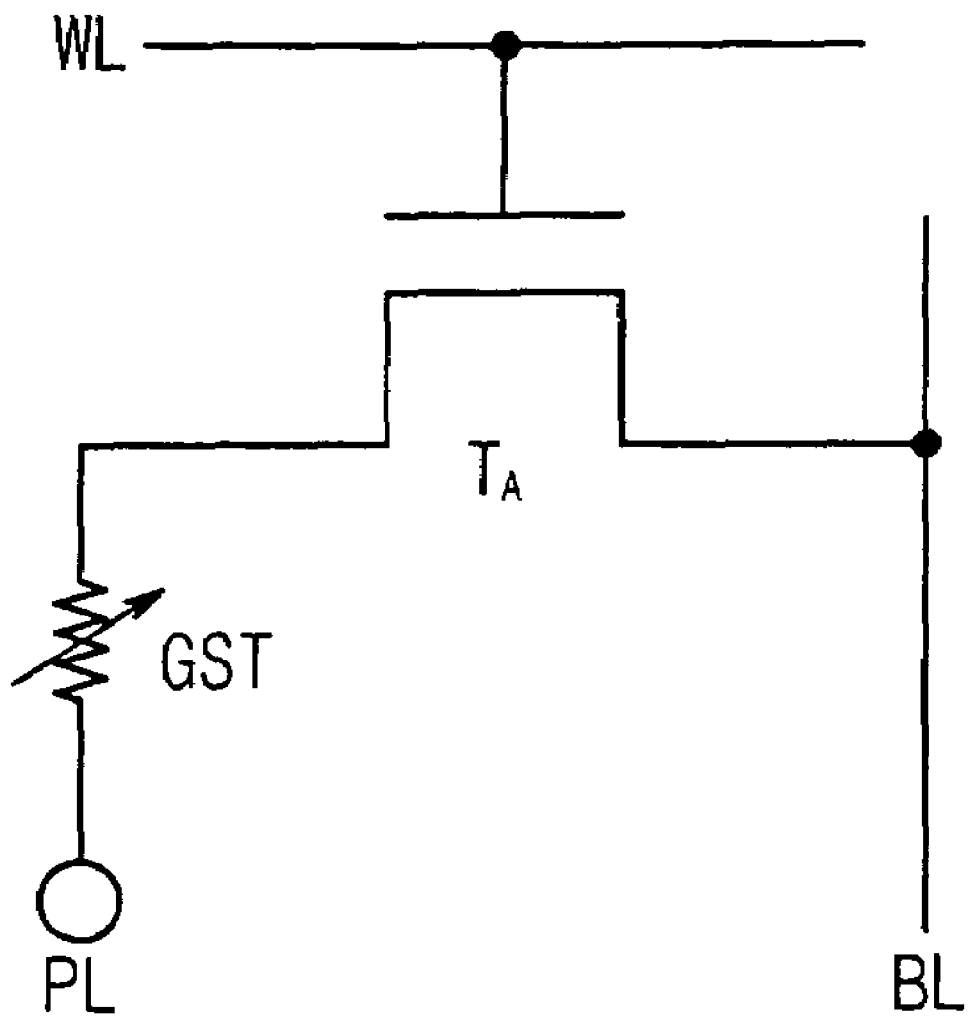
FIG. 2 is a circuit diagram showing the equivalent circuit of a conventional memory unit cell using the phase change resistance element.
Figure 3:
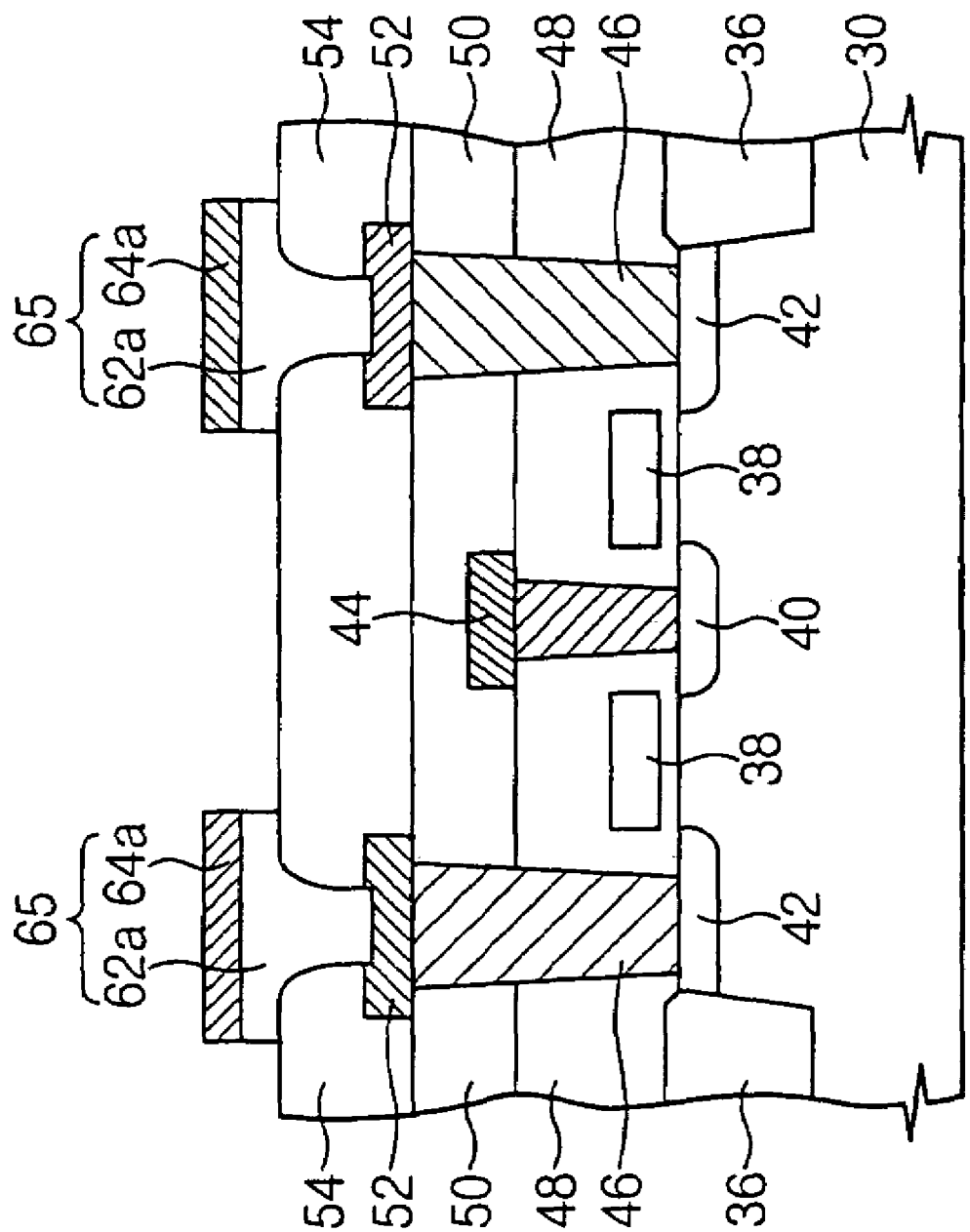
FIG. 3 is a cross section showing the sectional structure of a conventional phase change memory device formed on a semiconductor substrate.

Referring to FIG. 4, the unit cell includes an access transistor $T_A$ and a phase change resistance element GST. The upper electrode of the phase change resistance element GST is connected to a bit line BL. Additionally, the source of the access transistor $T_A$ is connected to the lower electrode of the phase change resistance element GST and the drain thereof is connected to a power line. The equivalent circuit of the present invention is different from that of FIG. 2 in that the drain region of the transistor $T_A$ is not connected to the bit line BL but is connected to the power line.

Referring to FIG. 5, a plurality of word lines (WL0, WL1, ..., WLn−1 and WLn) intersect a plurality of bit lines (BL0, BL1, . . . , BLn−1 and BLn) on the same plane, thus defining the regions of unit cells UC. In this case, each of the unit cells UC includes an access transistor $T_A$ and a phase change resistance element GST, as shown in FIG. 4.

Figure 6:
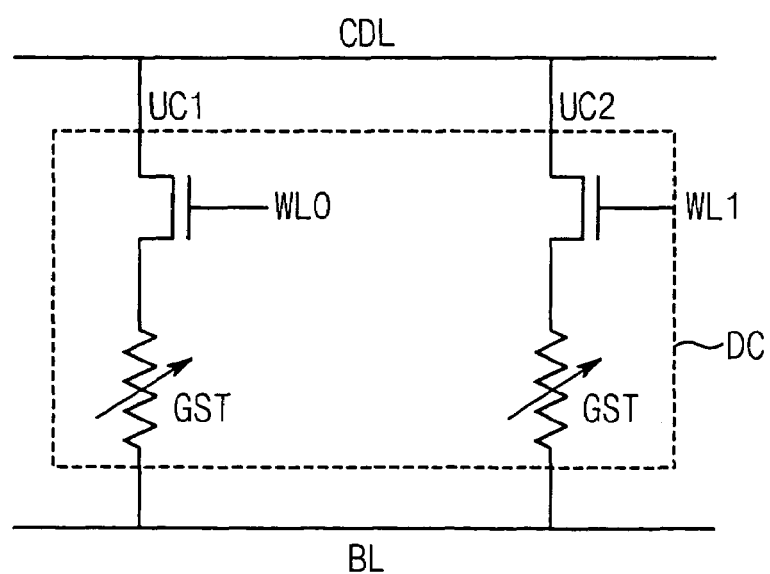
FIG. 6 is a circuit diagram showing the equivalent circuit of a standard cell DC in which two unit cells of FIG. 4 are laid out as a single unit according to the present invention.

FIG. 6 is a circuit diagram showing the equivalent circuit of a standard cell DC in which two unit cells of FIG. 4 are laid out as a single unit according to the present invention. In this case, the standard cell DC is defined for convenience because the standard cell DC is repeated in the memory array of the present invention.

Figure 7:
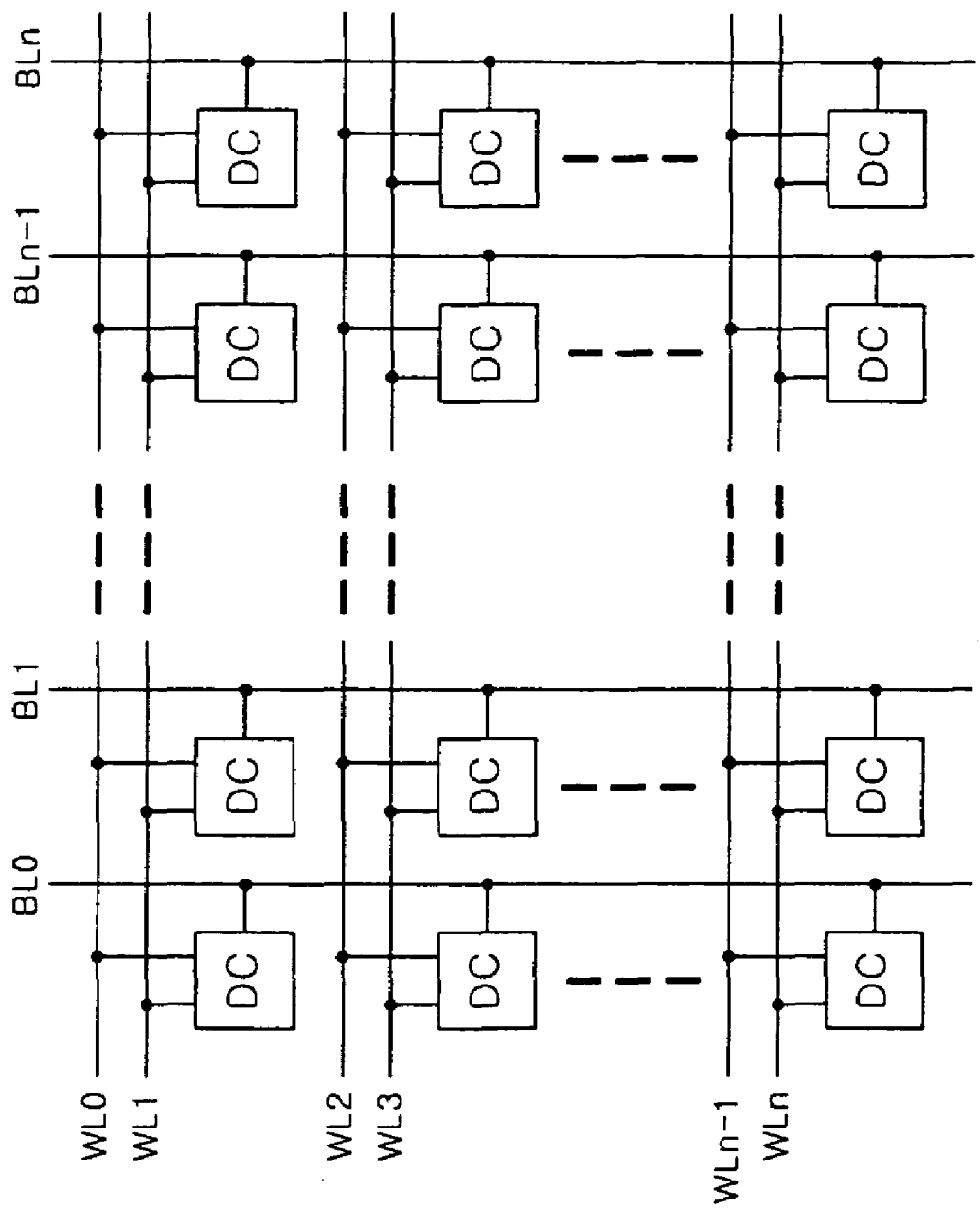
FIG. 7 is a block diagram showing the construction of a memory cell array into which the memory cell array of FIG. 5 is reconstructed in terms of the standard cell of FIG. 6.

Referring to FIG. 6, the standard cell DC includes the two unit cells UC1 and UC2. The unit cells UC1 and UC2 are connected in parallel between a bit line BL and a common drain line CDL, thus sharing the bit line BL and the common drain line CDL. The gates of transistors constituting the unit cells UC1 and UC2 are connected to word lines WL0 and WL1, respectively. FIG. 7 is a block diagram showing the construction of a memory cell array into which the memory cell array of FIG. 5 is reconstructed in terms of the standard cell of FIG. 6.

Figure 8:
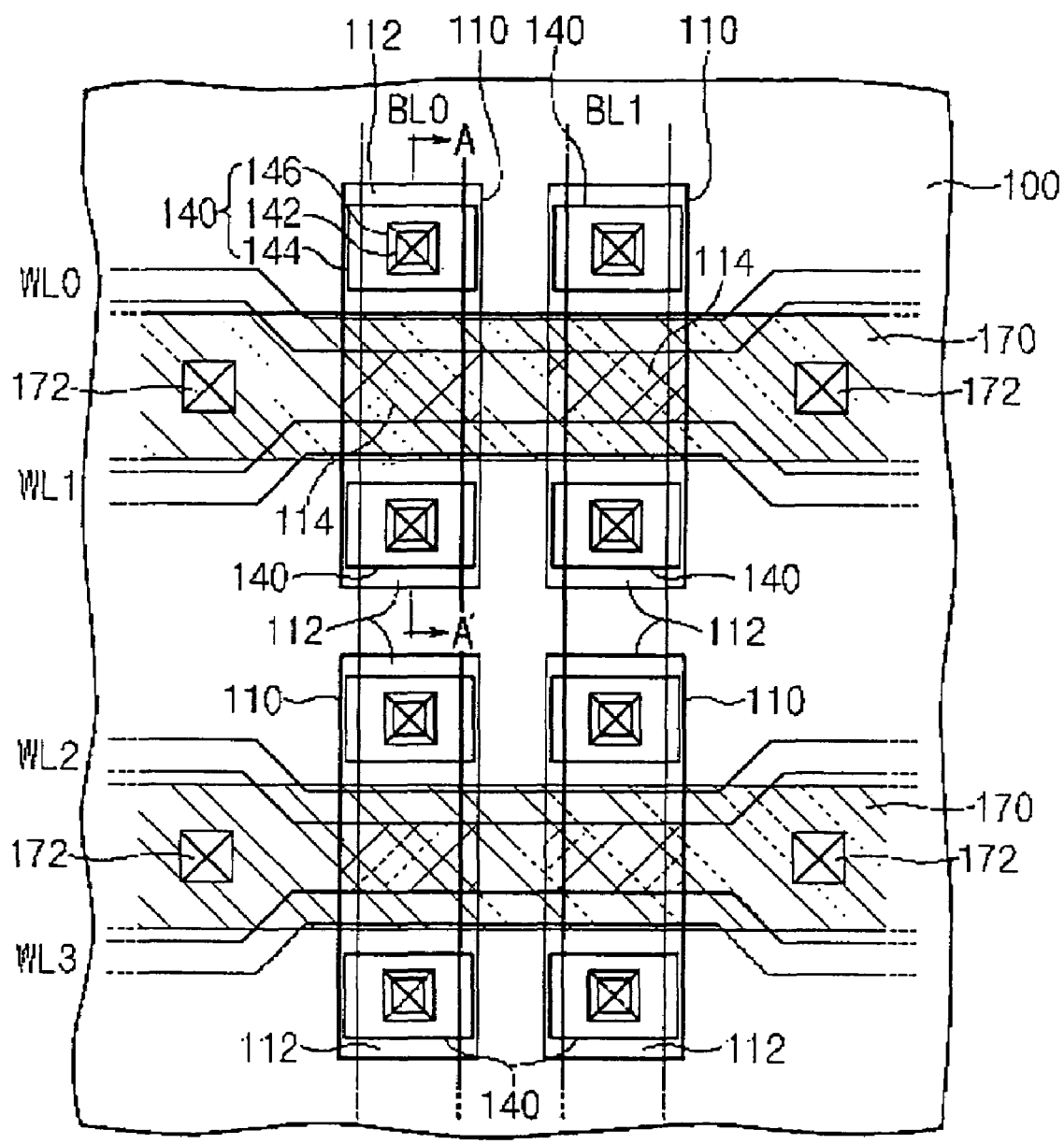
FIG. 8 is a plan view showing the memory cell array formed on a semiconductor substrate according to the present invention.

FIG. 8 is a plan view showing the memory cell array formed on a semiconductor substrate according to the present invention. In FIG. 8, the arrangement of memory cells is based on an open bit line architecture.

Referring to FIG. 8, a plurality of elongated first active regions 110 are arranged on the semiconductor substrate 100 in an x-axis direction. A plurality of word lines WL0 to WL3 are arranged in parallel on the semiconductor substrate 100 in such a way that a pair of word lines is extended in an x-axis direction to intersect a single first active region 100. The word lines WL0 to WL3 define the source regions 112 and drain regions of the first active regions 110, and function as the gates of the transistors each of which constitutes a unit cell. That is, the active region between the pair of word lines intersecting the single first active region 110 corresponds to the drain region 114, and the two regions outside the pair of word lines correspond to the source regions 112.

A phase change resistance element 140 including a lower electrode 142, a phase change resistance layer 144 and an upper electrode 146 is formed above each of the source regions 112 of the active regions. The phase change resistance element 140 is electrically connected to a corresponding source region 112 by a normal contact.

A plurality of bit lines BL0 to BL3 are arranged in parallel in a direction in which the bit lines BL intersect the word lines WL0 to WL3 at right angles, that is, a y-axis direction. The bit lines BL0 to BL3 are electrically connected to the upper electrodes 146 of phase change resistance elements 140. Accordingly, the source regions 112, the phase change resistance elements 140 and the bit lines BL0 to BL3 are arranged on the same lines when viewed in the vertical direction of the substrate, and the bit lines BL0 to BL3 are overlapped with the first active regions 110 as shown in the drawing.

In FIG. 8, two word lines (e.g., WL0 and WL1) intersecting a single active region 110, a bit line (e.g., BL0), and phase change resistance elements 140 formed on the source regions 112 of the active region 110 constitute a single standard cell DC as described in FIGS. 6 and 7.

Figure 9:
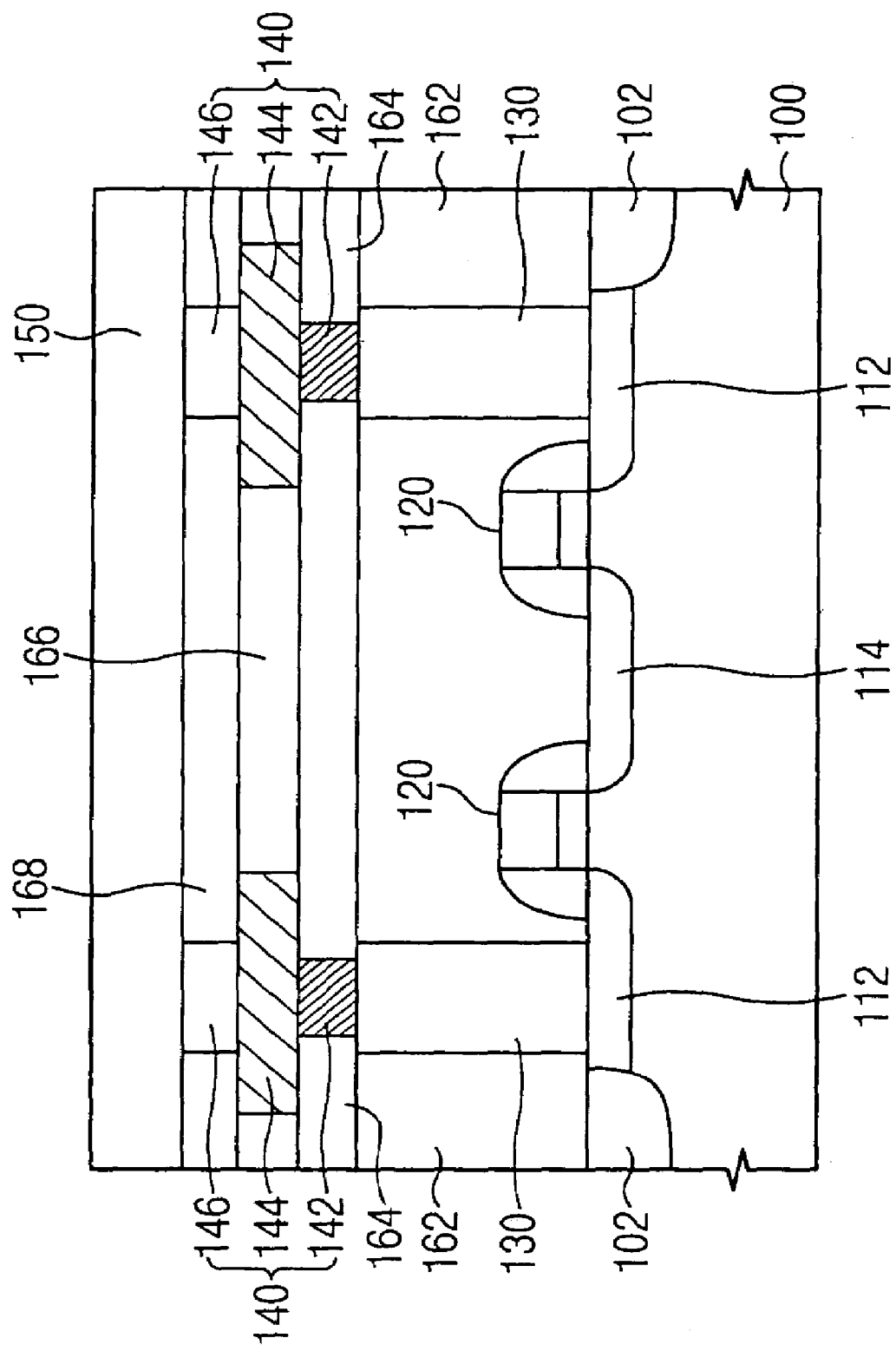
FIG. 9 is a cross section showing the sectional structure of the standard cell, which is taken along line A–A' of FIG. 8 across the single first active region.

FIG. 9 is a cross section showing the sectional structure of the standard cell DC, which is taken along line A–A' of FIG. 8 across the first active region 110. In this case, a method of manufacturing the memory cell array is not an essential part, and can be implemented by those who are skilled in the art using a method commonly used in a common DRAM manufacturing process, so that a description of a method of manufacturing the memory cell array is omitted.

Referring to FIG. 9, transistors 120, each of which includes a source region 112, a drain region and 114 and a gate, and isolation layers 102 are formed on a semiconductor substrate 100. The isolation layers 102 define the first active region 110 that was described with reference to FIG. 8. Additionally, even though not shown in the drawing because the drawing shows only the sectional structure, the isolation layers 102 have proper patterns to allow the second active region of FIG. 8 to be formed.

The source regions 112 of transistors 120 are connected to phase change resistance elements 140 through normal contacts 130, respectively. Each of the phase change resistance elements 140 includes a lower electrode 142, a phase change resistance film 144 and an upper electrode 146, and the upper electrode 146 is electrically connected to a bit line 150. In a process of patterning the normal contacts 130 and the phase change resistance elements 140, a plurality of interlayer-dielectrics 162, 164, 166 and 168 are introduced. The number of interlayer insulation films may vary according to manufacturing methods or the structures of components, so that the number of the interlayer-dielectrics does not have special significance in the drawing.

Referring to FIG. 8, a plurality of second active regions 170 are arranged on the semiconductor substrate 100 to intersect the plurality of first active regions at right angles. Each of the second active regions 170 is extended to intersect the center portions of two adjacent active regions 110, and is overlapped with the common drain regions 114 of two adjacent standard cells. The second active region 170 is a semiconductor region, which is formed on the same plane as the first active regions 110 on the semiconductor substrate 100, and has the same conductivity type as the source regions 112 and the drain region 114. For example, in the case where the access transistor is an n-channel transistor, the second active region 170 is constructed to have an n-type semiconductor. The second active region 170 electrically connects the common drain regions 114 of the two adjacent first active regions 110. Of course, a low resistance layer, such as Silicide compound, can be provided on a portion of the second active region 170 to provide a conductive path having lower resistivity.

In the above-described phase change memory cell array of the present invention, contacts for providing electrical connections are not placed on the common drain regions 114 of the first active regions 110. As shown in the drawing, the contacts for providing electrical connections are placed on the regions of the second active regions 170 outside the common drain regions 114.

The structure of the memory cell array has the following advantages. First, contacts for providing connections with the bit line or the common drain line do not need to be provided on the common drains 114. Accordingly, the gap between the pair of word lines (e.g, WL0 and WL1) intersecting the first active region 110 can be designed to be narrower. This can reduce the sizes of the first active region 110 and the standard cell, thus increasing the density of the memory cell.

Second, in the memory cell array of the present invention, contacts 172 for supplying signals to the common drains 114 are formed on the regions outside the first active regions 110. Accordingly, larger spaces required to form the contacts 172 can be secured by controlling the gaps between the word lines that are located near the contacts 172 as shown in FIG. 8.

In this embodiment, the second active regions 170 are electrically connected to the common drain line through the contacts 172, so that a power voltage $V_{AA}$ can be supplied to the common drain regions 114.

Meanwhile, although, in FIG. 8, common drain regions 114 have been described as corresponding to the contacts 172, this is only an example to assist the understanding of the present invention. In the memory cell array of the present invention, a considerably small number of contacts can be placed compared to the number of the contacts shown in the drawing, and the number of the contacts 172 is determined in view of the resistance of the contacts 172 and the second active regions 170.

Figure 10:
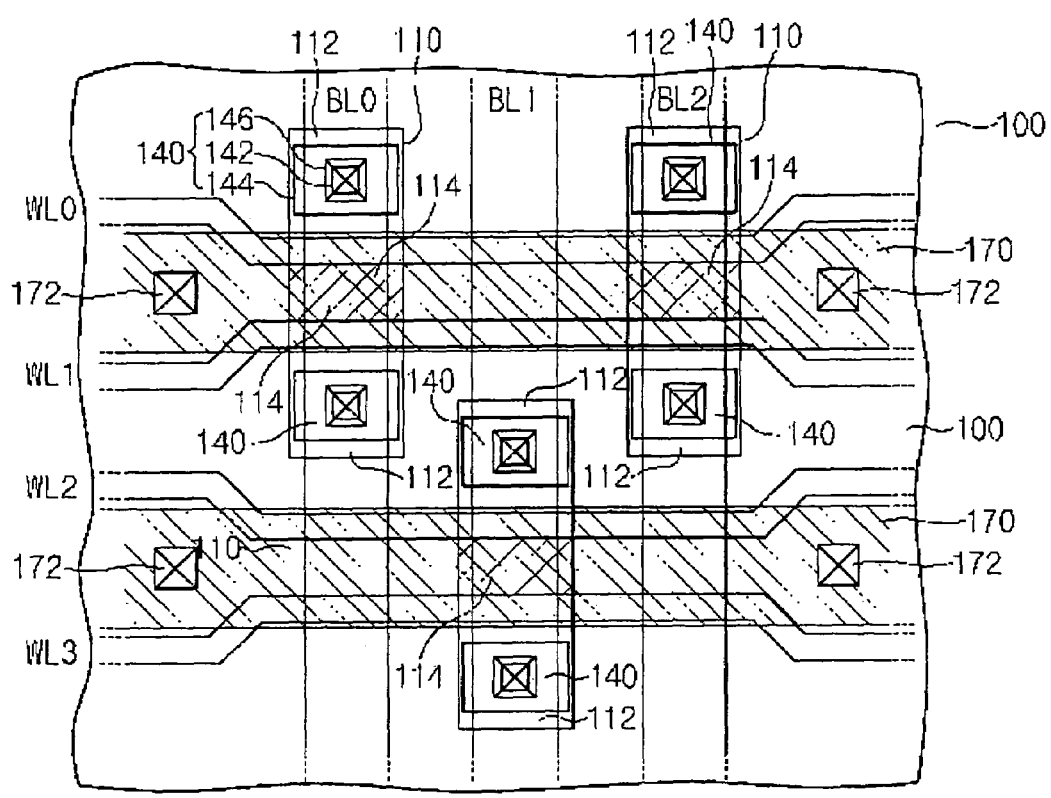
FIG. 10 is a plan view showing a memory cell array constituting the phase change memory device according to another embodiment of the present invention, which shows the memory cell array based on a folded bit line architecture in which a detection amplifier activates two adjacent bit lines in the array.

FIG. 10 is a plan view showing a memory cell array constituting the phase change memory device according to another embodiment of the present invention, which shows the memory cell array based on a folded bit line architecture in which a detection amplifier activates two adjacent bit lines in the array.

Referring to FIG. 10, first active regions 110 are arranged in zigzag differently from the matrix type-arrangement of the first active regions shown in FIG. 8. The construction of word lines (WL0, WL1, WL2 and WL3), bit lines (BL0, BL1, BL2 and BL3), and phase change resistance elements 140 formed above the first active regions 110 is the same as described in FIG. 8.

In this embodiment, a second active region 170 is electrically connected to the common drain regions 114 of the first active regions 110 that are located on the same line as the second active region 170, and contacts 172 for supplying a power voltage to the common drain regions 114 are formed on the regions of the second active region 170 outside the common drain regions 114. Accordingly, this embodiment can achieve an effect similar to that of the embodiment described with reference to FIG. 8.

According to the present invention, the size of the unit cell of the phase change memory cell can be reduced by forming contacts outside semiconductor active regions instead of forming the contacts on common drains. This fulfills the requirements of high density for semiconductors.

Furthermore, according to the present invention, a sufficient space for a contact forming process can be secured by forming the contacts outside the semiconductor active regions. Furthermore, the contact errors occurring by the misalignment of a mask can be reduced at the time of manufacturing the semiconductor.

Although the preferred embodiments of the present invention have been disclosed for illustrative purposes, it is possible to modify and apply the embodiments in various ways without departing from the scope and spirit of the invention. Furthermore, the embodiments and the drawings are used for the purpose of describing the invention in detail, not for the purpose of limiting the technical scope of the invention. Accordingly, those who are skilled in the art can substitute and modify the invention based on the embodiments and attached drawings that have been described without departing from the spirit of the invention, so that it should be appreciated that the rights of the invention includes not only the accompanying claims but also equivalents to the claims.

What is claimed is:

1. A phase change memory cell array, comprising:
   a first access transistor pair and a second access transistor pair formed on a semiconductor substrate to be adjacent to each other, each of the first and second access transistor pairs having a common drain;
   phase change resistance elements formed on source regions of the access transistors, respectively; and
   a semiconductor region formed on a same plane as the common drains to electrically connect the common drains of the first and second transistor pairs.

2. The phase change memory cell array as set forth in claim 1, wherein the semiconductor region is electrically connected to a power voltage.

3. The phase change memory cell array as set forth in claim 1, wherein each of the phase change resistance elements is electrically connected to a bit line.

4. The phase change memory cell array as set forth in claim 1, wherein the semiconductor region has a same conductivity type as the common drains.

5. A phase change memory device, comprising:
   a plurality of first active regions arranged at regular intervals on a semiconductor substrate;
   a plurality of word lines intersecting the first active regions and defining source regions and common drain regions of the first active regions;
   a plurality of bit lines intersecting the plurality of word lines at right angles;
   a plurality of second active regions located on a same plane as the common drain regions so as to connect at least two common drain regions that are adjacent to each other in a direction parallel to the word lines; and
   phase change resistance elements formed above the source regions of the first active regions, respectively, and electrically connected to bit lines.

6. The phase change memory device as set forth in claim 5, wherein the plurality of second active regions are extended to outsides of the at least two adjacent common drain regions in a direction parallel to the word lines; further comprising contacts formed on the second active regions outside the common drain regions to supply a power voltage to the common drain regions.

7. The phase change memory device as set forth in claim 6, wherein:
   the plurality of word lines define parts of the first active regions as the source regions and the common drain region in such a way that a pair of the word lines intersects the first active region; and
   a gap between the pair of word lines formed on the second active regions outside the common drain regions is wider than that formed on the common drain regions.

8. The phase change memory device as set forth in claim 5, wherein the second active regions are semiconductor regions having a same conductivity type as the common drain regions.

9. The phase change memory device as set forth in claim 5, wherein the bit lines are aligned on same lines as the first active regions when viewed in the vertical direction of the substrate.

* * * * *